US011709095B2

(12) United States Patent
Fan et al.

(10) Patent No.: US 11,709,095 B2
(45) Date of Patent: Jul. 25, 2023

(54) LIGHT SENSING MODULE

(71) Applicant: Egis Technology Inc., Hsinchu (TW)

(72) Inventors: Chen-Chih Fan, Hsinchu (TW); Bruce C. S. Chou, Hsinchu (TW)

(73) Assignee: Egis Technology Inc., Hsinchu (TW)

( * ) Notice: Subject to any disclaimer, the term of this patent is extended or adjusted under 35 U.S.C. 154(b) by 0 days.

(21) Appl. No.: 17/499,874

(22) Filed: Oct. 13, 2021

(65) Prior Publication Data

US 2022/0299361 A1 Sep. 22, 2022

Related U.S. Application Data

(60) Provisional application No. 63/234,250, filed on Aug. 18, 2021, provisional application No. 63/163,010, filed on Mar. 18, 2021.

(30) Foreign Application Priority Data

Sep. 9, 2021 (CN) .......................... 202111056360.X (51) Int. Cl.
*G01J 1/04* (2006.01)
*G01J 1/44* (2006.01)
(Continued)

(52) U.S. Cl.
CPC ............... *G01J 1/0422* (2013.01); *G01J 1/44* (2013.01); *G01J 2001/4466* (2013.01);
(Continued)

(58) Field of Classification Search
CPC .... G01J 1/0422; G01J 1/44; G01J 2001/4466; G01S 7/4863; G01S 7/481;
(Continued)

(56) References Cited

U.S. PATENT DOCUMENTS

| 9,356,185 B2 | 5/2016 | Rossi |
| 2004/0133863 A1 | 7/2004 | Dai et al. |

(Continued)

FOREIGN PATENT DOCUMENTS

| TW | 200918961 | 5/2009 |
| TW | M455171 | 6/2013 |

(Continued)

OTHER PUBLICATIONS

"Office Action of Taiwan Counterpart Application", dated Aug. 19, 2022, p. 1-p. 4.

*Primary Examiner* — John R Lee
(74) *Attorney, Agent, or Firm* — JCIPRNET (57) ABSTRACT

A light sensing module including a photodiode array substrate, a distance increasing layer, and a light converging element array is provided. The photodiode array substrate includes a plurality of light sensing units arranged in an array and a circuit region. The circuit region is disposed on the periphery of the light sensing units. Each of the light sensing units includes a plurality of adjacent photodiodes arranged in an array. The distance increasing layer is disposed on the photodiode array substrate. The light converging element array is disposed on the distance increasing layer, and includes a plurality of light converging units arranged in an array. Reflected light from an outside is converged by the light converging elements on the light sensing units, respectively.

24 Claims, 8 Drawing Sheets

(51) Int. Cl.
  *H01L 27/146*    (2006.01)
  *G01S 7/4863*    (2020.01)
(52) U.S. Cl.
  CPC ....... *G01S 7/4863* (2013.01); *H01L 27/14605* (2013.01); *H01L 27/14625* (2013.01); *H01L 27/14643* (2013.01)
(58) Field of Classification Search
  CPC ......... H01L 27/14605; H01L 27/14625; H01L 27/14643; H01L 31/02327; H01L 27/1443; H01L 27/1446; H01L 31/107
  See application file for complete search history.

(56) References Cited

U.S. PATENT DOCUMENTS

| | | | | |
|---|---|---|---|---|
| 2009/0101947 | A1* | 4/2009 | Lin | H01L 27/14627 |
| | | | | 257/292 |
| 2011/0079704 | A1* | 4/2011 | Yu | H01L 27/1461 |
| | | | | 977/762 |
| 2018/0329065 | A1* | 11/2018 | Pacala | G02B 27/0955 |
| 2018/0351012 | A1* | 12/2018 | Xue | H01L 31/03921 |
| 2019/0373187 | A1* | 12/2019 | Chhuor | G06F 3/04845 |
| 2020/0116836 | A1 | 4/2020 | Pacala et al. | |
| 2020/0327296 | A1* | 10/2020 | Wu | G02B 5/005 |
| 2021/0111211 | A1* | 4/2021 | Dilhan | H01L 27/14605 |

FOREIGN PATENT DOCUMENTS

| | | |
|---|---|---|
| TW | 201629437 | 8/2016 |
| TW | 201818096 | 5/2018 |

\* cited by examiner

LIGHT SENSING MODULE

CROSS-REFERENCE TO RELATED APPLICATION

This application claims the priority benefit of U.S. provisional application Ser. No. 63/163,010, filed on Mar. 18, 2021, U.S. provisional application Ser. No. 63/234,250, filed on Aug. 18, 2021 and China application ser. No. 202111056360.X, filed on Sep. 9, 2021. The entirety of each of the above-mentioned patent applications is hereby incorporated by reference herein and made a part of this specification.

BACKGROUND

Field of the Disclosure

The disclosure relates to a sensing module, and more particularly to a light sensing module.

Description of Related Art

With the development of optoelectronic technology, various photoelectric sensors have been developed, including LiDAR sensors, time-of-flight ranging sensors or image sensors. In LiDAR sensors or time-of-flight ranging sensors, there is a technology that uses a single photon avalanche diode (SPAD) array substrate to measure the flight time of light.

In conventional SPAD, each of the light sensing units arranged in an array is surrounded by a peripheral circuit of a considerable width. When the lens images the reflected light from the outside on the peripheral circuit outside the light sensing unit, this part of the light will not be sensed and will be wasted. In addition, this part of the light will form a blind zone that cannot be sensed at the position corresponding to the external space, resulting in a discontinuous sensing range in the external space of the sensing module that adopts the SPAD, and leading to multiple blind zones separated from each other. When an object under test happens to fall at the position of the blind zone, the distance of the object under test cannot be sensed.

SUMMARY OF THE DISCLOSURE

The disclosure provides a light sensing module, which has high light collection efficiency and can effectively solve the problem of blind zones caused by peripheral circuits.

An embodiment of the disclosure provides a light sensing module including a SPAD (single photon avalanche diode) array substrate, a distance increasing layer, and a light converging element array. The SPAD array substrate includes a plurality of light sensing units arranged in an array and a circuit region. The circuit region is arranged around these light sensing units, and each of the light sensing units includes a plurality of adjacent SPADs arranged in an array. The distance increasing layer is configured on the SPAD array substrate and covers these light sensing units or the light sensing units and part of the circuit region around them. The light converging element array is arranged on the distance increasing layer, and includes a plurality of light converging elements arranged in an array. The reflected light from the outside is converged by the light converging elements on the light sensing units, and each of the light converging elements covers the corresponding light sensing unit and a part of the circuit region around the light sensing unit.

An embodiment of the disclosure provides a light sensing module, including a photodiode array substrate, a distance increasing layer, and a light converging element array. The photodiode array substrate includes a plurality of light sensing units arranged in an array and a circuit region. The circuit region is arranged around the light sensing units, and each of the light sensing units includes a plurality of adjacent photodiodes arranged in an array, and the ratio of the area of these sensing units to the area of the circuit region ranges from 20% to 80%. The distance increasing layer is configured on the photodiode array substrate. The light converging element array is arranged on the distance increasing layer, and includes a plurality of light converging elements arranged in an array. Each of the light converging elements covers the corresponding light sensing unit and a part of circuit region around the light sensing unit.

In the light sensing module in the embodiment of the disclosure, a light converging element array configured on the distance increasing layer is adopted, and each of the light converging elements covers the corresponding light sensing unit and a part of the circuit region around the light sensing unit, and the reflected light from the outside is converged by these light converging elements on these light sensing units. Therefore, the reflected light from the outside can be effectively sensed by the light sensing unit, and is less likely to be irradiated onto the peripheral circuit region to cause ineffective sensing, thus effectively avoiding the formation of blind zone in the space caused by the peripheral circuit region. In this way, the light sensing module of the embodiment of the disclosure can have a higher light collection efficiency, and can effectively solve the problem of blind zones caused by peripheral circuits.

DESCRIPTION OF EMBODIMENTS

Figure 1:
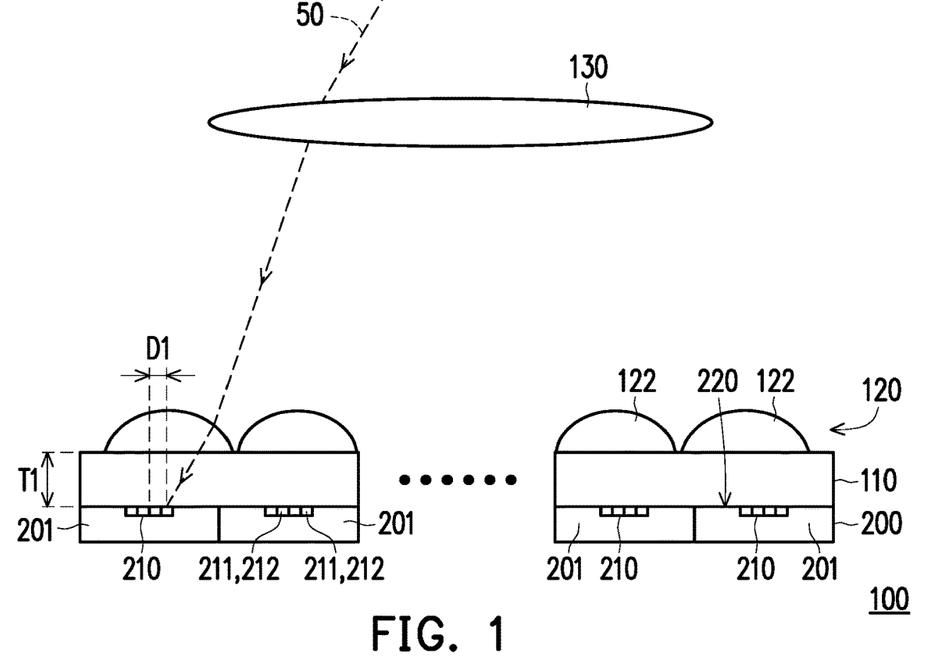
FIG. 1 is a schematic cross-sectional view of a light sensing module according to an embodiment of the disclosure.
Figure 2:
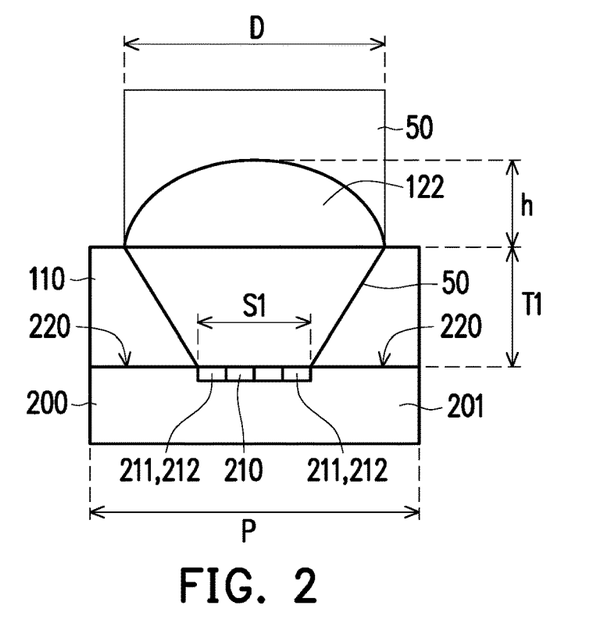
FIG. 2 is a schematic cross-sectional view illustrating a light converging element in FIG. 1 converging reflected light from the outside to a corresponding light sensing unit.
Figure 3:
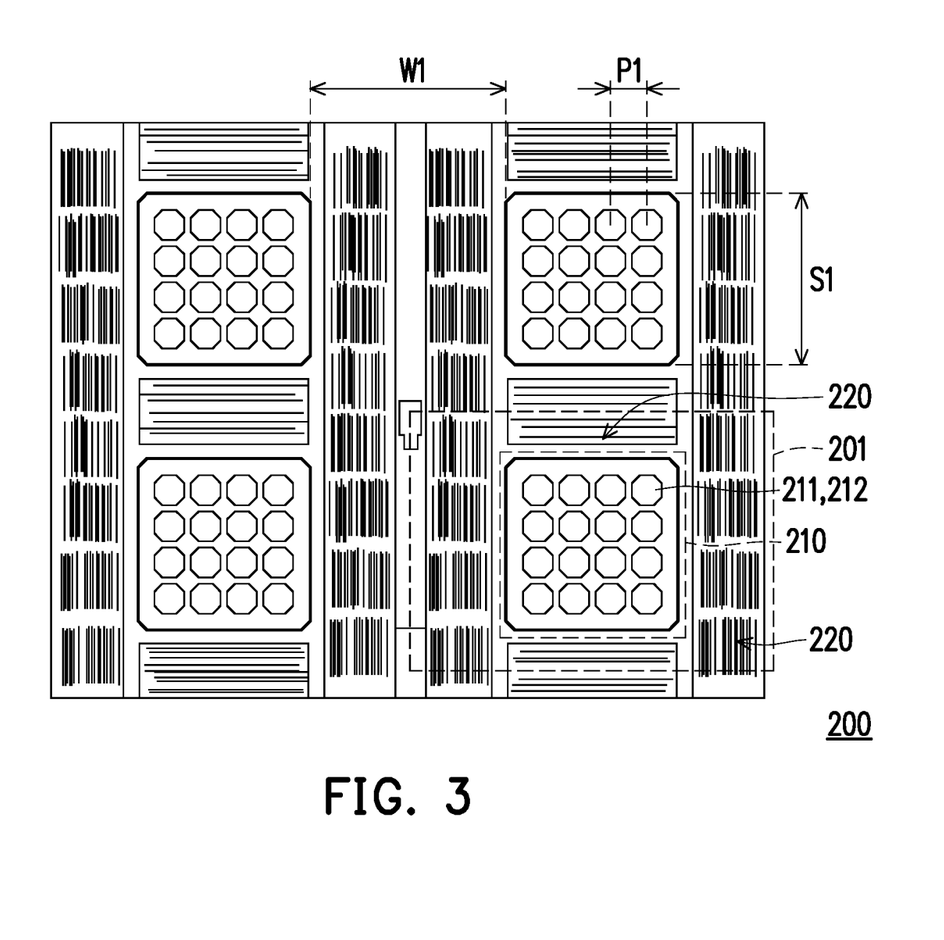
FIG. 3 is a schematic front view of the photodiode array substrate in FIG. 1.

FIG. 1 is a schematic cross-sectional view of a light sensing module according to an embodiment of the disclosure. FIG. 2 is a schematic cross-sectional view illustrating a light converging element in FIG. 1 converging reflected light from the outside to a corresponding light sensing unit. FIG. 3 is a schematic front view of the photodiode array substrate in FIG. 1. Referring to FIG. 1 to FIG. 3, the light sensing module 100 of this embodiment includes a photodiode array substrate 200, a distance increasing layer 110, and a light converging element array 120. The photodiode array substrate 200 includes a plurality of light sensing units 210 arranged in an array and a circuit region 220. The circuit region 220 is disposed around the light sensing units 210. Each of the light sensing units 210 includes a plurality of adjacent photodiodes 212 arranged in an array.

For example, each of the light sensing units 210 includes a plurality of adjacent pixels 211 arranged in an array, and the light sensing element of each of the pixels 211 is a photodiode 212. In this embodiment, the photodiode array substrate 200 is, for example, a SPAD array substrate, and the photodiode 212 is, for example, a SPAD, but the disclosure is not limited thereto. The ratio of the area of these sensing units to the area of the circuit region falls within the range of 20% to 80%. The circuits in the circuit region 220 may include driving circuits for driving the photodiode 212 and circuits for receiving the sensing signal from the photodiode 210, and may also include other circuits and electronic components (such as transistors, capacitors or resistors, etc.) required for the operation of the photodiode array substrate 200.

Unlike all the pixels of the image sensor, which are arranged at equal pitches, the photodiode array substrate 200 includes a plurality of sensing units 201, and each of the sensing units 201 includes a light sensing unit 210 and a circuit region 220. The pixels 211 in the photodiode array substrate 200 are divided into multiple groups of pixels 211 respectively corresponding to the light sensing units 210. The pitch of each of the group of pixels 211 is, for example, P1, but the distance (that is, the width W1 of the portion of the circuit region 220 between two adjacent light sensing units 210, that is, the distance between two adjacent light sensing units 210) between the two adjacent groups of pixels 211 will be relatively large, that is, the pitch P1 is smaller than the width W1. In addition, in this embodiment, the overall array of the photodiodes 212 of the light sensing unit 210 of each of the sensing units 201 is surrounded by the circuit region 220. In this embodiment, the photodiode array substrate 200 can be used as a light sensor of LiDAR or a light sensor in a time-of-flight ranging sensor, but the disclosure is not limited thereto.

The distance increasing layer 110 is disposed on the photodiode array substrate 200. The light converging element array 120 is disposed on the distance increasing layer 110 and includes a plurality of light converging elements 122 arranged in an array. The reflected light 50 from the outside is converged on the light sensing units 210 by the light converging elements 122 respectively, and the reflected light 50 from the outside is transmitted to the light sensing units 210 through the light converging elements 122 and the distance increasing layer 110 in sequence.

In this embodiment, the light sensing module 100 further includes a lens 130 disposed above the light converging element array 120 to image the reflected light 50 from the outside on the photodiode array substrate 100. In other words, the reflected light 50 from the outside passes through the lens 130, the light converging element array 120, and the distance increasing layer 110 in sequence to be transmitted to the light sensing units 210. The lens 130 may include at least one lens, and the at least one lens may include at least one convex lens.

In this embodiment, each of the light converging elements 122 is a lens, such as a convex lens. It can be seen from FIG. 2 that the reflected light 50 from the outside is converged on the light sensing units 210 by the light converging elements 122 respectively, and will not be irradiated onto the peripheral circuit region 220 to cause ineffective sensing. Therefore, the light sensing module 100 of this embodiment can have a higher light collection efficiency. In this embodiment, each of the light converging elements 122 covers a sensing unit 201, that is, covers the corresponding light sensing unit 210 and a part of the circuit region 220 around the light sensing unit 210. In this embodiment, the ratio of the orthographic projection area of each of the light converging elements 122 on the photodiode array substrate 100 to the area of the corresponding sensing unit 201 falls within the range of 0.5 to 1.0.

Figure 4A:
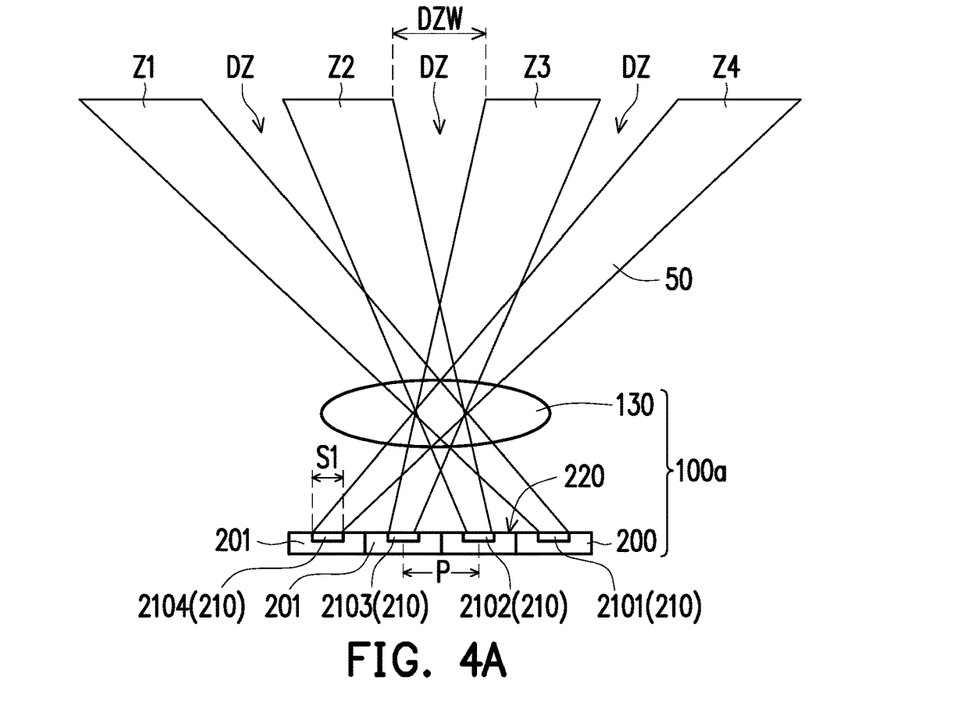
FIG. 4A is a schematic view of the optical path of the control group of the light sensing module of FIG. 1, and the control group is not provided with a distance increasing layer and a light converging element array.

FIG. 4A is a schematic view of the optical path of the control group of the light sensing module of FIG. 1, and the control group is not provided with a distance increasing layer and a light converging element array. FIG. 4B illustrates the optical path change after adding a light converging element and the distance increasing layer thereunder to the control group of FIG. 4A. As shown in FIG. 4A, the light sensing unit 210 may include light sensing units 2101, 2102, 2103, and 2104 (the light sensing unit 210 of the four sensing units 201 is adopted for exemplary description, but the disclosure is not limited thereto). The light 50 emitted from zones Z1, Z2, Z3, and Z4 at a certain distance (for example, 5 meters) from the control group 100a of the light sensing module will be converged by the lens to the light sensing units 2101, 2102, 2103, and 2104, respectively. However, there are three blind zones DZ between the zone Z1 and the zone Z2, between the zone Z2 and the zone Z3, and between the zone Z3 and the zone Z4. When the object under test is located in the blind zone DZ, the light from the object under test cannot be transmitted to the light sensing unit 210 and be sensed, but is transmitted to the circuit region 220 by the lens 130 and cannot be sensed. As a result, the control group 100a of the light sensing module will not be able to sense the object located in the blind zone DZ, and thus cannot calculate the distance of the object located in the blind zone DZ, and even cause misjudgment on the external environment in the application of distance measurement.

The width DZW of the blind zone DZ is approximately 2×object distance×(1−a)×tan(FOV/2/√2)/the number of sensing units in the horizontal direction. In the equation, a is the ratio of the side length S1 of each of the light sensing units 210 to the pitch P (equivalent to the pitch P of the light sensing unit 210) of the sensing unit 201, FOV is the field of view of the lens 130, and the object distance is the distance from the lens 130 to the zones Z1 to Z4, and the number of sensing units in the horizontal direction is 4 in FIG. 4A.

Figure 4B:
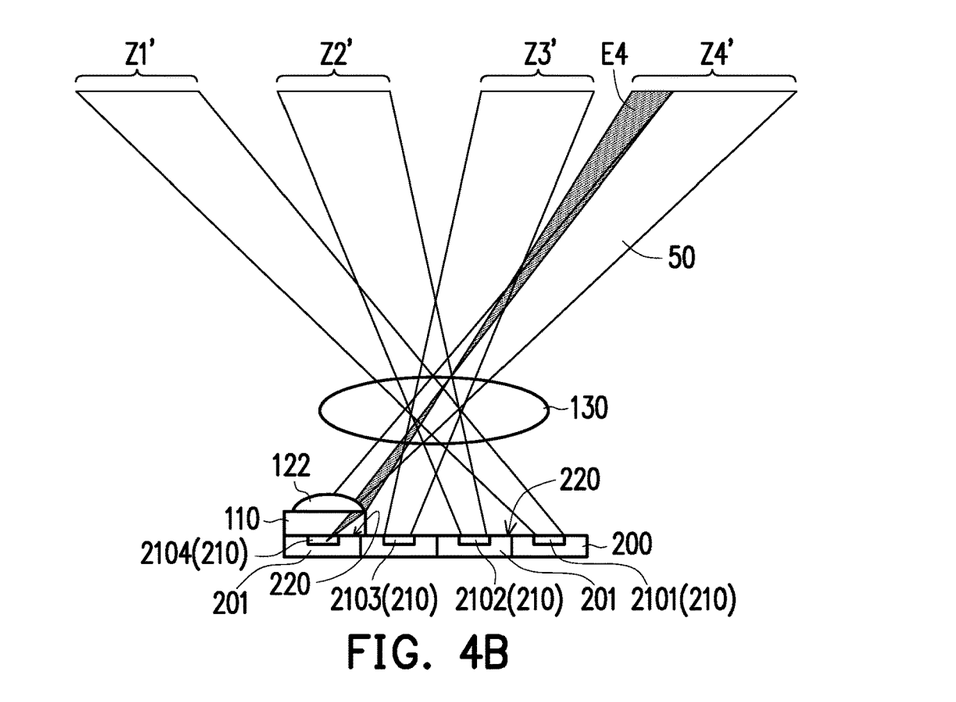
FIG. 4B illustrates the optical path change after adding a light converging element and the distance increasing layer thereunder to the control group of FIG. 4A.

As shown in FIG. 4B, when the light converging element 122 and the distance increasing layer 110 are added to the light sensing unit 2104, the original zone Z4 will be expanded into a zone Z4' with an additional extended zone EZ added from the side. If the light converging element 122 is not added, the location of the extension zone EZ is in the blind zone DZ of FIG. 4A, and the light here will be projected into the circuit region 220 on the right side of the light sensing unit 2104 and cannot be sensed. However, when the light converging element 122 is added, the light 50 from the extended zone EZ will be converged by the light converging element 122 to the peripheral region of the light sensing unit 2104, and be sensed by the light sensing unit 2104. If the distance increasing layer 110 and the light converging element 122 can also be added onto the light sensing units 2101, 2102, and 2103, the original zone Z1, zone Z2, and zone Z3 in FIG. 4A will also be expanded into zone Z1', zone Z2' and zone Z3' as shown in FIG. 4B. The zone Z1', zone Z2', zone Z3' and zone Z4' are connected as a whole, that is, there is no blind zone between each adjacent two of the zone Z1', zone Z2', zone Z3' and zone Z4'. In this way, it is possible to effectively avoid the problem of blind zones in the space caused by the peripheral circuit region 220. In particular, when the light sensing module 100 is used for distance measurement, it is possible to effectively avoid misjudgment on the external environment.

Please refer to FIG. 1, FIG. 2 and FIG. 3 again, in this embodiment, the side length S1 of each of the light sensing units 210 falls within the range of 20 μm to 80 μm, and the distance (that is, the above-mentioned width W1) between two adjacent light sensing units 210 falls within the range of 15 μm to 50 μm. The distance increasing layer 110 is a transparent layer, for example, a layer that is transparent to the reflected light 50 from the outside that the light sensing unit 210 intends to detect. Moreover, the ratio of the thickness T1 of the distance increasing layer 110 to the focal lengths of the light converging elements 122 falls in the range of 0.2 to 0.8. In an embodiment, the thickness of the distance increasing layer 110 falls within a range of 20 μm to 50 μm. The distance increasing layer 110 can be used to increase the distance between the light converging element 122 and the light sensing unit 210 to achieve a good converging effect on the reflected light 50 from the outside.

In this embodiment, at a position deviated from the center of the photodiode array substrate 200, each of the light converging elements 122 deviates toward the center of the photodiode array substrate 200 relative to the corresponding light sensing unit 210. As shown in FIG. 1, the light converging element 122 at the edge deviates toward the center by a distance D1 relative to the corresponding light sensing unit 210. In addition, the closer the light converging element 122 is to the edge of the photodiode array substrate 200, the greater the deviation toward the center relative to the corresponding light sensing unit 210. In this way, the obliquely incident light 50 from the lens 130 can be accurately converged in the light sensing unit 210.

Figure 5:
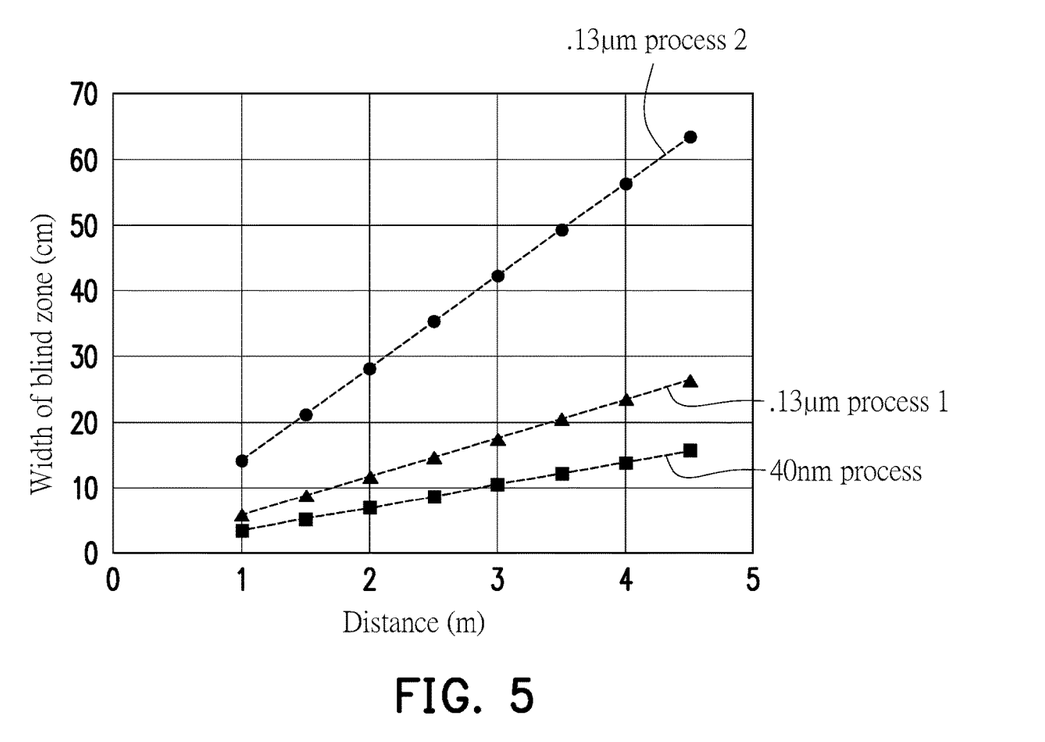
FIG. 5 is a diagram showing the relationship between the width of the blind zone and the object distance when the control group of the light sensing module of FIG. 4A adopts different semiconductor manufacturing processes.

FIG. 5 is a diagram showing the relationship between the width of the blind zone and the object distance when the control group of the light sensing module of FIG. 4A adopts different semiconductor manufacturing processes. Please refer to FIG. 3, FIG. 4A and FIG. 5. The ".13 μm process 1" in FIG. 5 refers to the use of a .13 μm semiconductor process to manufacture the photodiode array substrate 200, in which the ratio of the side length S1 of the light sensing unit 210 to the distance (that is, the above-mentioned width W1) between the two adjacent light sensing units 210 is 72/30. The ".13 μm process 2" refers to the use of a .13 μm semiconductor process to manufacture the photodiode array substrate 200, in which the ratio of the side length S1 of the light sensing unit 210 to the distance (that is, the above-mentioned width W1) between the two adjacent light sensing units 210 is 50/75. Moreover, "40 nm process" refers to the data obtained by using a 40 nm semiconductor process to manufacture the photodiode array substrate 200. It can be clearly seen from FIG. 5 that as the object distance increases, the level of manufacturing process is lower and the blind zone becomes larger. Therefore, the light sensing module 100 adopting the light converging element array 120 in this embodiment can also be applied to lower-level semiconductor manufacturing processes, so as to avoid the formation of blind zones while effectively reducing manufacturing costs.

The figure of merit (FoM) of the light converging element array 120 in design can be defined as DZW/object distance, and FoM=2×(1−a)×tan(FOV/2/√2)/number of sensing units in horizontal direction. In the application of direct time-of-flight ranging multi-area sensors, the FoM normally needs to be less than 4% to meet product requirements. The design of the light converging element array 120 in this embodiment can achieve a FoM of less than 1%, and such design can be developed without using higher-level semiconductor manufacturing processes, which can save costs of product and improve competitiveness. For example, when the FOV of the product specification is 62 degrees (in diagonal direction) and the number of sensing units in the horizontal direction is 8, the FoM can be expressed as FoM=0.1×(1−a). If the product specification FoM<1%, that is, DZW<5 cm at 5 meters, a=0.9 (that is, the width of the light sensing unit 210 being 0.9 times the width of the sensing unit 201) can be obtained from the above relationship equation. Therefore, if the diameter of the light converging element 122 is designed to be greater than 90% of the pitch P (equivalent to the pitch P of the light sensing unit 210), of these sensing units 201, the product specification of FoM<1% can be satisfied. Typically, the pitch P of direct time-of-flight ranging multi-area products is designed to fall with a range of 50 μm to 100 μm. Therefore, depending on the specifications of FoM, the diameter of the light converging element 122 falls within the range of about 40 μm to 100 μm.

Please refer to FIG. 2 again, in order to make the light converging element 122 achieve better product performance, a distance increasing layer 110 may be adopted. The distance increasing layer 110 can be defined as the layer in the distance from the bottom of the light converging element 122 to the light sensing unit 210, which can include an inter-metal dielectric (IMD) layer and other layers that allow the light 50 to pass through in the semiconductor process. The distance increasing layer 110 can cooperate with the light converging element 122 and at least two pixels 211 (or even at least four pixels 211) of the light sensing unit 210 to make an optimal design. Typically, the thickness T1 of the distance increasing layer 110 substantially satisfies T1=F×(D−S1)−h, and F is the f-number of the light converging element 122, D is the diameter of the light converging element 122, h is the thickness of the light converging element 122, and S1 is the side length of the light sensing unit 210. In the equation, the above relationship assumes that the refractive index of the materials of the light converging element 122 and the distance increasing layer 110 are the same (both are approximately 1.5). Because the light converging element 122 has aberrations and depth of field, there can be a tolerance of 20% between the thickness T1 of the distance increasing layer 110 and the above equation. That is to say, the system formed by the light converging element 122 and the distance increasing layer 110 satisfies (F×(D−S1)−h)×0.8≤T1≤(F×(D−S1)−h)×1.2. Typically, the diameter D of the light converging element 122 is approximately in the range of 40 μm to 100 μm, so the thickness of the distance increasing layer 110 normally falls in the range of 20 μm to 50 μm. If there are differences in the materials of the various structural layers, the difference in optical path caused by the difference in refractive index can be further considered, but it can also be deduced based on the principle.

Figure 6A:
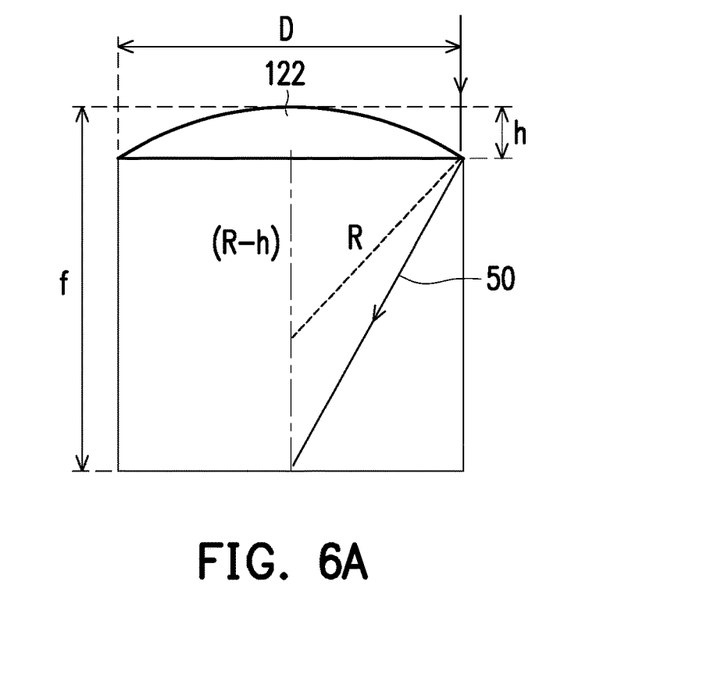
FIG. 6A and FIG. 6B are schematic cross-sectional views illustrating some parameters of the light converging element and the distance increasing layer during design.
Figure 6B:
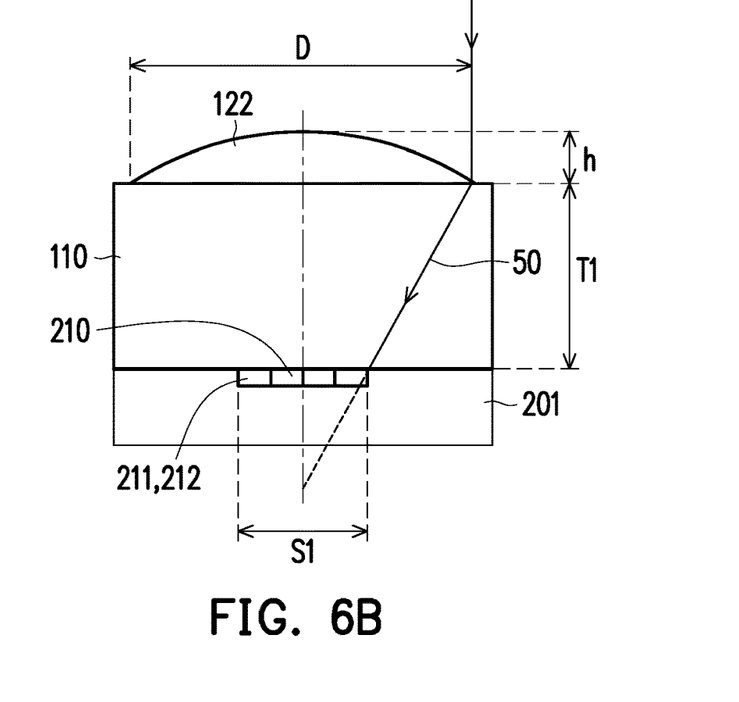

FIG. 6A and FIG. 6B are schematic cross-sectional views illustrating some parameters of the light converging element 122 and the distance increasing layer 110 during design. Please refer to FIG. 2, FIG. 6A and FIG. 6B, the above-mentioned relationship expression T1=F×(D−S1)−h is obtained through the above calculation.

First, $$F=f/D \qquad \text{Equation 1}$$

In the equation, f is the focal length of the light converging element 122.

Based on the triangle relationship in FIG. 6A, it can be obtained that $$R^2 = (R-h)^2 + \left(\frac{D}{2}\right)^2,$$

R is the radius of curvature of the light converging element 122 (that is, the lens), this expression can be sorted into:

$$R = \frac{h^2 + (D/2)^2}{2h} \qquad \text{Equation 2}$$

In addition, $$f \sim \frac{nR}{(n-1)}, \qquad \text{Equation 3}$$

and n is ane refractive index of the light converging element 122.

By substituting equation 2 into equation 3, the following can be obtained:

$$f \sim \frac{n}{(n-1)} \times \frac{h^2 + (D/2)^2}{2h} \qquad \text{Equation 4}$$

By substituting equation 4 into equation 1, the aperture value F of the system of the light converging element 122 can be obtained.

In addition, based on the triangular geometric relationship in FIG. 6B, the following can be obtained:

$$\frac{f - (T1 + h)}{f} = \frac{S1}{D}$$

Therefore, the thickness T1 of the distance increasing layer 110, the side length S1 of the light sensing unit 210, and the aperture value F designed for the light converging element 122 can be expressed as T1=F×(D−S1)−h.

Figure 7:
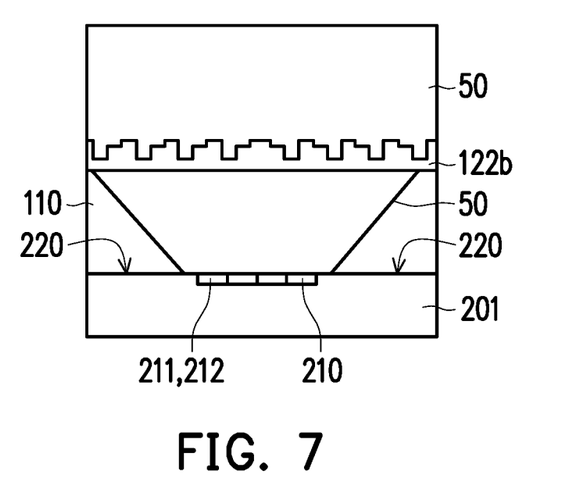
FIG. 7 is a schematic cross-sectional view illustrating a modification of the light converging element in FIG. 1 that converges the reflected light from the outside to a corresponding light sensing unit.

FIG. 7 is a schematic cross-sectional view illustrating a modification of the light converging element in FIG. 1 that converges the reflected light from the outside to a corresponding light sensing unit. Please refer to FIG. 1, FIG. 2 and FIG. 7. In another embodiment, each of the light converging elements 122 in FIG. 1 and FIG. 2 can be replaced by the light converging element 122b of FIG. 7, and the light converging element 122b is a diffractive optical element (DOE). The light converging element 122b can also achieve the effect of converging the reflected light 50 from the outside to the light sensing unit 210.

Figure 8A:
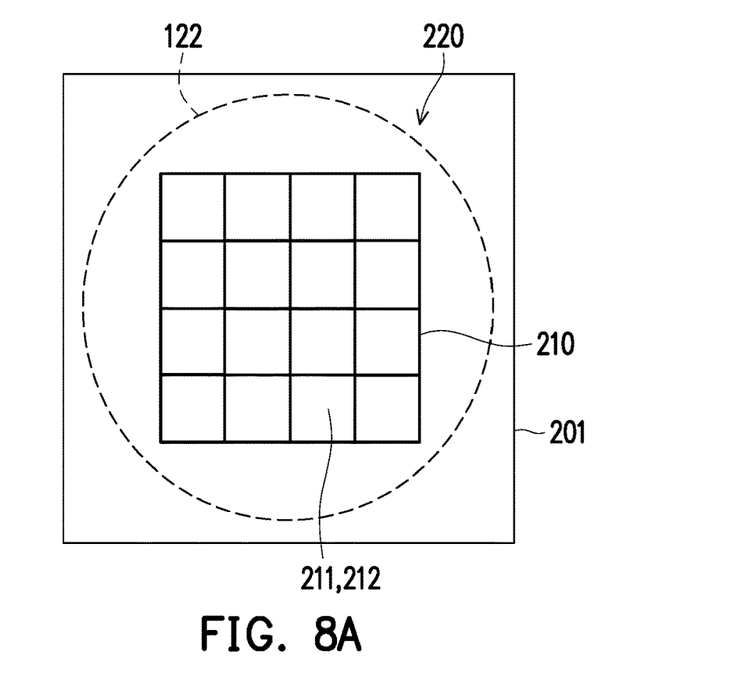
FIG. 8A shows a schematic top view of the structure of FIG. 2.
Figure 8B:
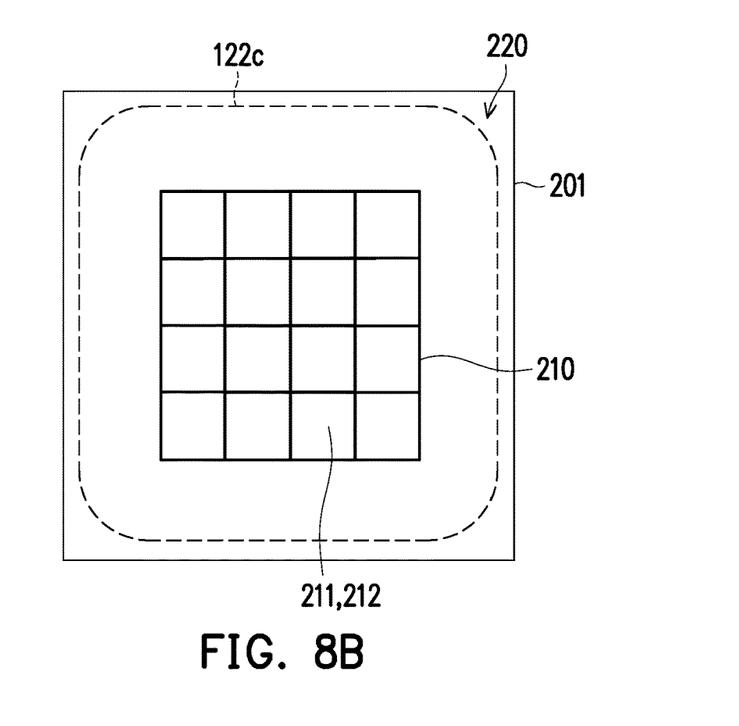
FIG. 8B is another modification of the structure of FIG. 8A.

FIG. 8A shows a schematic top view of the structure of FIG. 2. FIG. 8B is another modification of the structure of FIG. 8A. Please refer to FIG. 8A. In the embodiments of FIG. 1 to FIG. 3, each of the light converging elements 122 in the top view is, for example, a circle, as shown in FIG. 8A. However, in another embodiment, as shown in FIG. 8B, each of the light converging elements 122c in the top view may also be a square.

Figure 9:
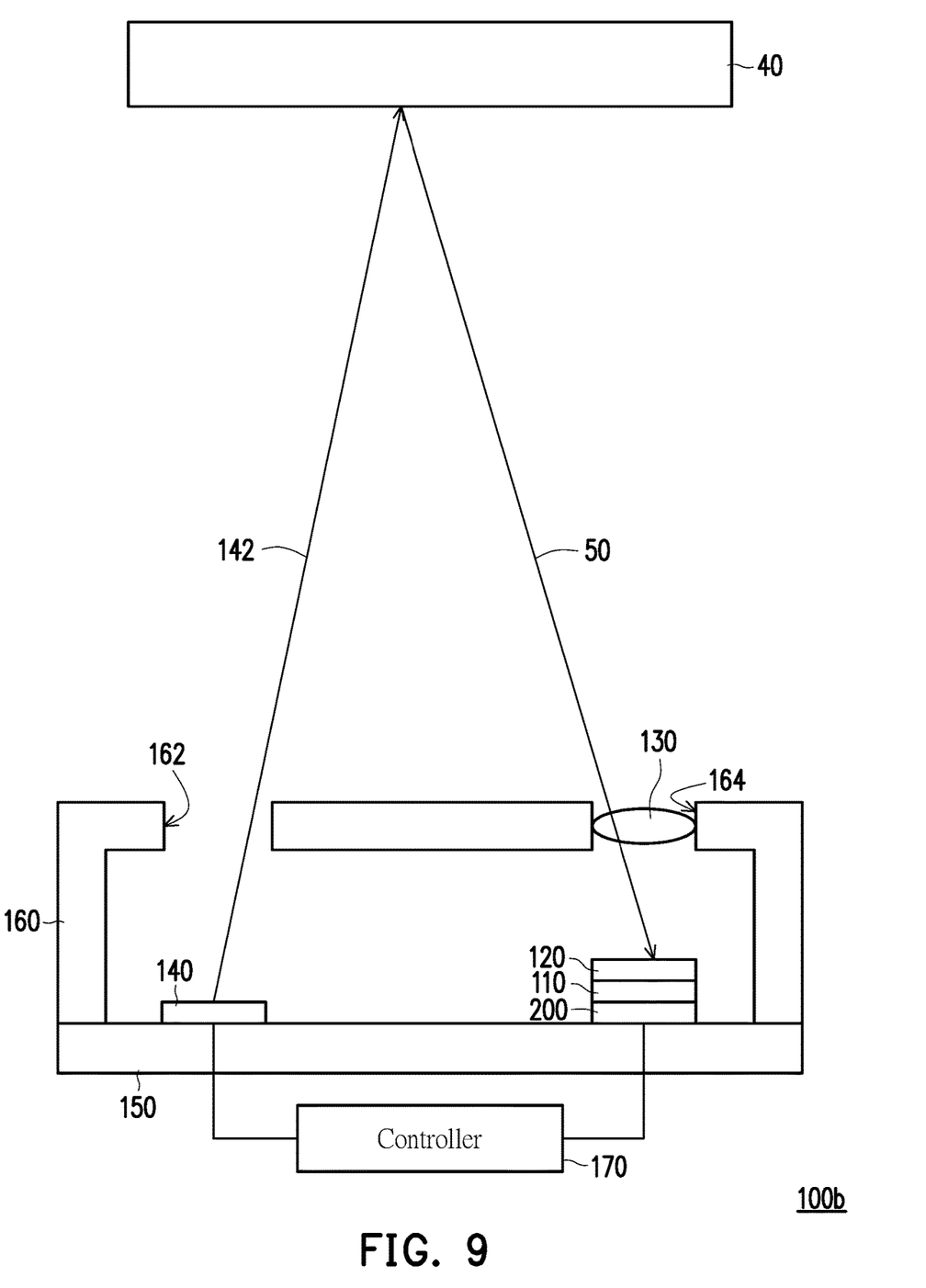
FIG. 9 is a schematic cross-sectional view of a light sensing module according to another embodiment of the disclosure.

FIG. 9 is a schematic cross-sectional view of a light sensing module according to another embodiment of the disclosure. Referring to FIG. 9, the light sensing module 100b of this embodiment is similar to the light sensing module 100 of FIG. 1, and the difference between the two is as follows. The light sensing module 100b further includes a light source 140 for emitting a light beam 142. After the light beam 142 irradiates an object 40 from the outside, the light beam 142 is reflected by the object 40 into reflected light 50 from the outside. The light source 140 may be a semiconductor laser, and the light beam 142 is, for example, a laser beam. The light source 140, the photodiode array substrate 200, the distance increasing layer 110 and the light converging element array 120 may be disposed on a substrate 150 and covered by a housing 160. The opening 162 and the opening 164 on the housing 160 can be respectively passed through by the light beam 142 and the reflected light 50 from the outside. The lens 130 may be disposed in the opening 164, and the reflected light 50 from the outside is transmitted to the photodiode array substrate 200 through the lens 130, the light converging element array 120 and the distance increasing layer 110 in sequence.

The light sensing module 100b may further include a controller 170, which is electrically connected to the light source 140 and the photodiode array substrate 200, and is configured to calculate the distance of the object 40 according to the flight time or phase of the light beam 142 and the light 50. In other words, the light sensing module 100b may be a time-of-flight ranging device or a LiDAR.

In an embodiment, the controller 170 is, for example, a central processing unit (CPU), a microprocessor, a digital signal processor (DSP), a programmable controller, a programmable logic device (PLD) or other similar devices or combinations of these devices; the disclosure is not limited thereto. Moreover, in an embodiment, various functions of the controller 170 can be implemented as a plurality of program codes. These program codes are stored in a memory, and the controller 170 executes these program codes. Alternatively, in an embodiment, various functions of the controller 170 may be implemented as one or more circuits. The disclosure provides no limitation to the use of software or hardware to implement the functions of the controller 170.

In summary, in the light sensing module of the embodiment of the disclosure, a light converging element array configured on the distance increasing layer is adopted, and each of the light converging elements covers the corresponding light sensing unit and part of the circuit region around the light sensing unit. Furthermore, the reflected light from the outside are converged by the light converging elements on the light sensing units. Therefore, the reflected light from the outside can be effectively sensed by the light sensing unit, and is less likely to be irradiated onto the peripheral circuit region to cause ineffective sensing, thus effectively avoiding the formation of blind zone in the space caused by the peripheral circuit region. In this way, the light sensing module of the embodiment of the disclosure can have a higher light collection efficiency, and can effectively solve the problem of blind zones caused by peripheral circuits.

What is claimed is:

1. A light sensing module, comprising:
   a SPAD (single photon avalanche diode) array substrate, comprising:
      a plurality of light sensing units, arranged in array; and
      a circuit region, arranged around the light sensing units, and each of the light sensing units comprising a plurality of adjacent SPADs arranged in array;
   a distance increasing layer, configured on the SPAD array substrate and covering the light sensing units; and
   a light converging element array, arranged on the distance increasing layer, and comprising a plurality of light converging elements arranged in array, wherein a reflected light from the outside is converged by the light converging elements on the light sensing units, and each of the light converging elements covers the corresponding light sensing unit and a part of the circuit region around the light sensing unit,
   wherein the overall SPADs arranged in array of each of the light sensing units are surrounded by the circuit region.

2. The light sensing module according to claim 1, wherein a pitch of the SPADs in each of the light sensing units is smaller than a width of a portion of the circuit region between the two adjacent light sensing units.

3. The light sensing module according to claim 1, wherein each of the light sensing units and the part of the circuit region around the light sensing unit form a sensing unit, and a ratio of an orthographic projection area of each of the light converging elements on the SPAD array substrate to an area of the corresponding sensing unit falls within a range of 0.5 to 1.0.

4. The light sensing module according to claim 1, further comprising a lens, which is arranged above the light converging element array.

5. The light sensing module according to claim 1, wherein a side length of each of the light sensing units falls within a range of 20 µm to 80 µm, and a distance between the two adjacent light sensing units falls within a range of 15 µm to 50 µm.

6. The light sensing module according to claim 1, wherein the distance increasing layer is a transparent layer, and a ratio of a thickness of the distance increasing layer to a focal length of the light converging elements falls within a range of 0.2 to 0.8.

7. The light sensing module according to claim 1, wherein a thickness of the distance increasing layer falls within a range of 20 µm to 50 µm.

8. The light sensing module according to claim 1, wherein each of the light converging elements is a lens or a diffractive optical element.

9. The light sensing module according to claim 1, wherein at a position deviated from a center of the SPAD array substrate, each of the light converging elements deviates toward the center of the SPAD array substrate relative to the corresponding light sensing unit.

10. The light sensing module according to claim 1, wherein the light sensing module satisfies $(F\times(D-S1)-h)\times 0.8 \leq T1 \leq (F\times(D-S1)-h)\times 1.2$, in which T1 is a thickness of the distance increasing layer, F is an aperture value of each of the light converging elements, D is a diameter of each of the light converging elements, S1 is a side length of each of the light sensing units, and h is a thickness of each of the light converging elements.

11. The light sensing module according to claim 1, wherein each of the light converging elements in a top view is a circle or a square.

12. The light sensing module according to claim 1, wherein a diameter of each of the light converging elements falls within a range of 40 µm to 100 µm.

13. A light sensing module, comprising:
   a photodiode array substrate, comprising:
      a plurality of light sensing units arranged in array; and
      a circuit region, arranged around the light sensing units, and each of the light sensing units comprising a plurality of adjacent photodiodes arranged in array, wherein a ratio of an area of the light sensing units to an area of the circuit region ranges from 20% to 80%;
   a distance increasing layer, configured on the photodiode array substrate; and
   a light converging element array, arranged on the distance increasing layer, and comprising a plurality of light converging elements arranged in array, wherein each of the light converging elements covers the one light sensing unit and a part of the circuit region around the one light sensing unit,
   wherein the overall photodiodes arranged in array of each of the light sensing units are surrounded by the circuit region.

14. The light sensing module according to claim 13, wherein a pitch of the photodiodes in each of the light sensing units is smaller than a width of a portion of the circuit region between the two adjacent light sensing units.

15. The light sensing module according to claim 13, wherein each of the light sensing units and the part of the circuit region around the light sensing unit form a sensing unit, and a ratio of an orthographic projection area of each of the light converging elements on the photodiode array substrate to an area of the corresponding sensing unit falls within a range of 0.5 to 1.0.

16. The light sensing module according to claim 13, further comprising a lens, which is arranged above the light converging element array.

17. The light sensing module according to claim 13, wherein a side length of each of the light sensing units falls within a range of 20 µm to 80 µm, and a distance between the two adjacent light sensing units falls within a range of 15 µm to 50 µm.

18. The light sensing module according to claim 13, wherein the distance increasing layer is a transparent layer, and a ratio of a thickness of the distance increasing layer to a focal length of the light converging elements falls within a range of 0.2 to 0.8.

19. The light sensing module according to claim 13, wherein a thickness of the distance increasing layer falls within a range of 20 µm to 50 µm.

20. The light sensing module according to claim 13, wherein each of the light converging elements is a lens or a diffractive optical element.

21. The light sensing module according to claim 13, wherein at a position deviated from a center of the photodiode array substrate, each of the light converging elements deviates toward the center of the photodiode array substrate relative to the corresponding light sensing unit.

22. The light sensing module according to claim 13, wherein the light sensing module satisfies $(F\times(D-S1)-h)\times 0.8 \leq T1 \leq (F\times(D-S1)-h)\times 1.2$, in which T1 is a thickness of the distance increasing layer, F is an aperture value of each of the light converging elements, D is a diameter of each of the light converging elements, S1 is a side length of each of the light sensing units, and h is a thickness of each of the light converging elements.

23. The light sensing module according to claim 13, wherein each of the light converging elements in a top view is a circle or a square.

24. The light sensing module according to claim 13, wherein a diameter of each of the light converging elements falls within a range of 40 μm to 100 μm.

* * * * *